(12) United States Patent
Pachler et al.

(10) Patent No.: US 8,226,276 B2
(45) Date of Patent: Jul. 24, 2012

(54) MOUNTING LENSES FOR LED MODULES

(75) Inventors: Peter Pachler, Graz (AT); Stefan Tasch, Jennersdorf (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 449 days.

(21) Appl. No.: 12/526,206

(22) PCT Filed: Dec. 11, 2007

(86) PCT No.: PCT/EP2007/010819
§ 371 (c)(1),
(2), (4) Date: Aug. 12, 2009

(87) PCT Pub. No.: WO2008/098606
PCT Pub. Date: Aug. 21, 2008

(65) Prior Publication Data
US 2010/0002450 A1    Jan. 7, 2010

(30) Foreign Application Priority Data
Feb. 14, 2007    (EP) ..................................... 07102375

(51) Int. Cl.
*F21V 17/00* (2006.01)
(52) U.S. Cl. .................. 362/311.02; 362/433; 362/452; 362/455
(58) Field of Classification Search .................. 362/310, 362/311.02, 311.05, 311.06, 249.02, 800, 362/311.14, 319, 433, 452, 455; 257/98–100, 779; 445/1
See application file for complete search history.

(56) References Cited

U.S. PATENT DOCUMENTS

| | | | |
|---|---|---|---|
| 4,959,761 A | 9/1990 | Critelli et al. | |
| 6,180,962 B1 * | 1/2001 | Ishinaga | 257/99 |
| 6,573,537 B1 | 6/2003 | Steigerwald et al. | |
| 2005/0179041 A1 * | 8/2005 | Harbers et al. | 257/80 |
| 2005/0249463 A1 | 11/2005 | Wilson et al. | |
| 2006/0108594 A1 | 5/2006 | Iwasaki et al. | |

FOREIGN PATENT DOCUMENTS

| | | |
|---|---|---|
| EP | 0579438 A2 | 1/1994 |
| EP | 1187226 A1 | 3/2002 |
| EP | 1566847 A1 | 8/2005 |
| JP | 2006080251 A | 3/2006 |
| JP | 2006140281 A | 6/2006 |

OTHER PUBLICATIONS

International Search Report for PCT/EP2007/010819 dated Apr. 2, 2008.

* cited by examiner

*Primary Examiner* — Thomas Sember
(74) *Attorney, Agent, or Firm* — Marshall, Gerstein & Borun LLP

(57) ABSTRACT

An LED module comprises an LED chip mounted on a substrate, a lens, and a metal holder mechanically holding the lens and being soldered on the substrate. The holder can be designed such that it holds the lens such that there is an air gap between the light exit surface of the LED chip and the bottom face of the lens.

16 Claims, 3 Drawing Sheets

MOUNTING LENSES FOR LED MODULES

BACKGROUND OF THE INVENTION

1. Field Of The Invention

The present invention is generally located in the field of mounting lenses of an LED light-emitting divides module on a substrate, such as a printed circuit board (PCB), such that the lens will be in a defined position vis-à-vis an LED chip of the LED module.

2. Related Technology

The lenses are generally used to achieve a defined radiation pattern and/or smaller viewing angles. The lens can be used in combination with other beam shaping elements such as for example an reflector or an iris.

When lenses are in direct contact with the LED chip (i.e. without air gap) they have to be considered as a primary optics. These type of lenses, where between the light exit from the chip and the lens surface the refractive index does not change, are called immersion type lenses. If there are minor refractive index changes e.g. from silicone with refractive index 1.4 and e.g. Glass with refractive index 1.49-1.65, the lens will still act like a immersion type lens and is basically primary optics. If basically the refractive index on a lens element is the same before entrance and after the exit, the lens is called an non-immersion type lens and can be called secondary optics.

On the other hand, if there is an air gap (or another optical element) and thus a substantial change in the refractice index in the light path from the LED chip to the lens, they are considered as secondary optics.

Lenses as primary optics are common in the field of LED modules and often used as immersion type lens. Such LED modules often consist of a lead frame where the chip is usually placed in a small reflector and the lens is positioned by over molding the LED chip. Typically epoxy resin is used as a material for the lens, which has the disadvantage of limited light stability and yellow-degradation, which is particular an issue for blue and white LEDs. Also glass and silicone resin or silicone rubber as well as polymethyl methacrylate (PMMA) or polycarbonate (PC) or other suitable thermoplastics cana be used, as long as they are transparent or for some application colored and can be brought in the form of a lens.

Such type of lenses do also have the disadvantage that not all of the light is collected due to the fact that light can only be redirected up to an angle of $\arcsin(1/n_{epoxy})$ which is some 40 degrees for a refractive index of the epoxy resin of 1.5. Therefore, for small beam shapes of e.g. 10° only light from +/−45° can be collected due to this limitation (without the use of additional light directing methods which basically also requires bigger lens diameters to become effective.)

For a surface emitting device with Lambertian radiation pattern this means that maximum 50% of the emitted light will be redirected into the desired angular range. Due to total refraction which occurs at the limiting angle, the figure of merit is in reality lower, normally reaching e.g. around 25% depending on the chip size and the lens size.

At higher viewing angles (e.g. lenses with an viewing angle of 90°) a second limit due to molding technology and the demolding process has to be taken into account as for such applications the shapes have to be undercut. Such undercut shapes can not be demolded and are therefore rarely used.

Reflector-based primary optics approaches do also exist. Although with a long parabolic shape of the side walls of the lens and partial metalisation of the side walls very high efficiencies can be achieved, the production of such reflector based LED modules turned out to be difficult.

Refraction and reflection can also be combined to achieve a maximum output of the LED module, wherein the central portion of the light beam is refracted and the side emissions are reflected allowing almost 100% of the light output to exit the LED module. However, the design and production of such combined refraction/reflection LED modules does lead to bigger diameters of the LED package and can therefore only applied when sufficient space is provided in the application.

The third principle of beam shaping in LED modules is using a diaphragm which in terms of figures of merit is inefficient as most of the light emitted from the LED chip will be blinded out.

With thermoplastic materials limits regarding the soldering process do exist and only methods where the lens is protected from the required temperature for the soldering are suitable.

The term 'secondary optics' already suggests that another optics is already in place, which primary optic can e.g. be an air gap between the LED chip and the secondary optics. Secondary optics are known which are a combination of an inner refractive optic and an outer reflective (e.g. based on total reflection) optics. The efficiency is basically sufficient as almost all of the light can be directed into the desired angular range except losses of reflection which do always happen on surfaces which change the refractive index. These known parts are usually manufactured by an injection molding process. Therefore, these lenses can not be produced by overmolding, but have to be applied in a second manufacturing step.

FIG. 4 shows a prior art LED module known from JP 2006140281 A. According to this document a LED chip 103 is mounted on a metal stem 102 from which a plurality of leads 101 formed of a conductive material are extracted outside. A lens holder 106 to which a glass lens 107 is temporarily fastened by silicone resin is so welded and integrated on the metal stem 102 as to surround the LED chip 103. Thereafter, silicone resin having translucency and flexibility is injected as the sealing resin 10 into a space formed by the metal stem 102, lens holder 106 and glass lens 107 to resin-seal the LED chip 103 and bonding wires 104.

Also this prior art document JP 2006140281 A relies on a first manufacturing step which is the welding of the LED chip on the metal stem 102 and then a second manufacturing step which is the injection of the silicone resin in order to mount the lens holder 106 and the glass lens 107.

SUMMARY OF THE INVENTION

In view of this prior art document, the present invention facilitates the mounting of a secondary optics lens.

According to the invention the secondary optics lens can be mounted using a reflow solder process. As it is well known from the prior art, reflow soldering is a means to attach a surface mounted component to a circuit board and typically consists of applying solder paste, positioning the devices and reflowing the solder in a conveyorized oven. During the reflow process the powder particles and the solder paste melt, with the surfaces being joint together and solidify the solder to create a strong metallurgical bond.

(In contrast thereto, when wave soldering, a quantity of molten solder is held in a tank and the components are inserted into a place on the PCB and loaded PCB is passed across a pumped wave or cascade of solder.)

Accordingly, the invention provides an LED module, comprising: an LED chip or an LED package mounted on a substrate, a lens, and a metal holder mechanically holding the lens and being soldered on the substrate.

According to a first aspect of the present invention a LED module is proposed comprising a LED package which does only emit to one half room and comprises one or more diodes having a plane emitting surface. The LED package is mounted on a substrate, such as for example a circuit board (PCB). A metal holder is mechanically holding a lens (made e.g. from a glass or a silicone), wherein the metal holder is soldered, preferably by reflow soldering, on the substrate such that the lens is acting as a secondary optics for the light emitted by the LED chip.

Preferably the LED chip is mounted as a SMD package and is soldered on the substrate in one soldering step, together with the pre-assembled holder/lens unit.

The holder can be designed such that it holds the lens in a manner that there is an air gap between the light exit surface of the LED chip and the bottom face of the lens.

The air gap can be in the order to e.g. 0.1 mm to 0.3 mm.

The metal holder can comprise spring arms for elastically engaging the lens outer surface.

The spring arms can engage a peripheral groove or recess provided in the outer surface of the lens.

The metal holder can comprise a connection part for connecting the spring arms, wherein the connection part is preferably at least partially provided between the bottom face of the lens and the substrate. Thus the holder also acts as a spacer e.g. for defining the air gap.

The lens can be made from a glass or a silicone.

The metal holder can be soldered on a plurality of solder pads provided on the substrate.

The metal holder can hold the lens by clamping it.

The lens can have the shape of a hemisphere of a part thereof.

The invention also provides an LED module with an LED chip mounted on the substrate (PCB, etc.), a lens in the metal holder from mechanically holding the lens as a secondary optic over the LED chip. The metal holder can engage a portion of the bottom surface of the lens, which bottom surface is directed towards the LED chip.

Thus, the metal holder can e.g. hold the lens by elastically clamping it.

The invention also provides a method for mounting a lens as a secondary optics over an LED chip, the method comprising the steps of mechanically holding the lens in a metal holder and mounting the LED chip on a substrate, before (reflow) soldering the metal holder as one unit together with a mechanically held lens on the substrate.

BRIEF DESCRIPTION OF THE DRAWINGS

Further features, advantages and objects of the present invention will become evident for the skilled person when reading the enclosed detailed description of preferred embodiments, when taking in conjunction with the figures of the enclosed drawings.

Figure 1:
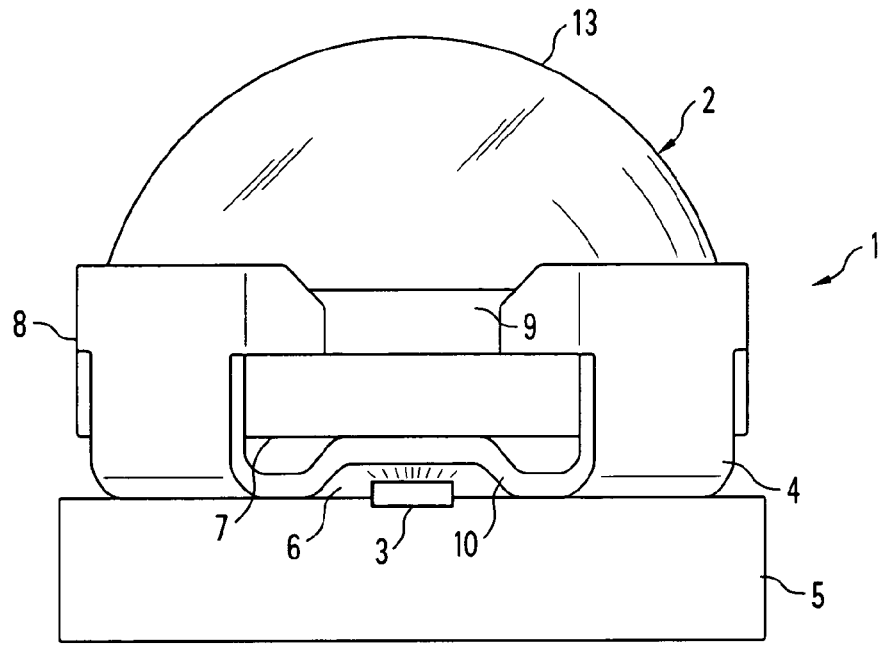
FIG. 1 shows a lateral view of a LED module according to the present invention.

As can be seen from FIG. 1, the present invention proposes to use a lens 1, preferably made out of a glass or a silicone as a secondary optics over a LED chip 3 mounted on a substrate, such as for example a PCB 5 and thus forming a LED module 1. The LED chip 3 can be on top of the surface of the substrate or in a recessed position. The LED chip can be mounted chip-on-board or preferably as a SMD package.

DETAILED DESCRIPTION

According to the invention the lens 2 is mechanically held by a metal holder 4 which is soldered on the substrate 5. Thus the metal holder 4 allows the mounting, by soldering, of the not solderable lens 2. Thus the LED chan be soldered in one (e.g. reflow) soldering step together with the pre-assembled holder/lens unit.

During manufacturing, in a first step the lens 2 and the holder 8 are mounted (e.g. 'clipped') together and then placed in a reel. For manufacturing of the LED module 1 according to the present invention, a surface mounted device (SMD) pick-and-place machine can be used wherein first a solder paste is printed on the substrate (circuit board) 5 and then the SMD package (LED chip 2) and if applicable, other electronic components can be placed, before the lens is placed together with the holder 4 above the SMD package comprising the LED chip. Finally, the reflow soldering process is carried out.

This allows an easier production process using standard manufacturing equipment resulting in the manufacturing of a highly efficient LED module 1 in one process step. The combination of the lens 2 and the metal holder 8 thus constitutes a 'solderable lens package'. The materials used esp. regarding the holder 4, are thus adapted to a reflow solder process. Preferably glass is used as material for the lens 2 as it withstands a reflow process and in addition, does not degrade with blue, white or even ultraviolet light.

The metal holder (which can also be considered a frame) 4 constitutes a fixture for the lens 2 and constitutes and adapter for the reflow solder process.

As can be seen from FIG. 1, the holder 4 is positioned when soldered on the substrate 5 such that the bottom surface 7 of the lens 2 is spaced by an air gap 6 between the light exit surface of the LED chip 3 and the bottom surface 7 of the lens 2.

A portion 10 of the metal holder 8 is arranged between the bottom face 7 of the lens 2 and the substrate surface 5 in order to assume a spacer function defining the width of the air gap 6.

This mounting has be advantage of a non-rigid fixation, such that differing CTEs (coefficient of thermal expansion) do not influence the reliability of the mounting as the metal holder 4 will absorb the differences during the expansion, which differences would otherwise lead to stress between the substrate and the lens.

As can also be seen from FIG. 1, the metal holder 4 preferably engages the lens 2 in a clamping manner. In the shown embodiment this is achieved by means of spring arms 8 engaging a peripheral groove 9 (e.g. having an open rectangular cross-section) or a recession (see reference 15 in FIG. 3).

Thus, the lens/holder unit will be integrally mounted by the mechanical clamping between the spring arms 8, the peripheral groove 9 or the recess and the bottom surface 7 of the lens 2.

Contrary to prior art thus no additional fastening, e.g. by a silicone resin is necessary for holding together the lens 2 and the holder 4, although such additional fastening can be added as is also encompassed by the invention.

Figure 2:
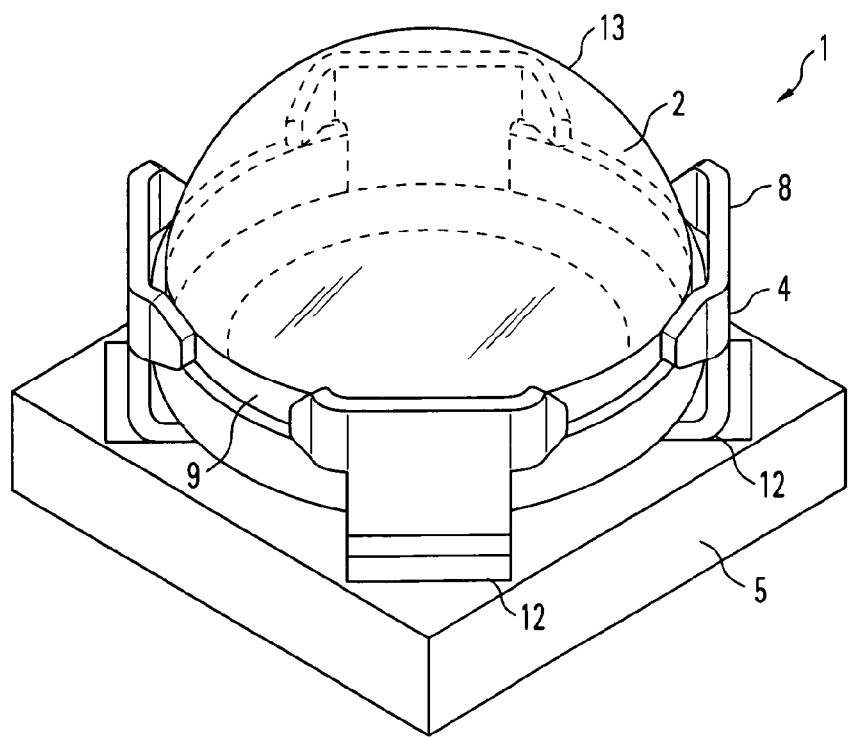
FIG. 2 shows a perspective view.
Figure 3:
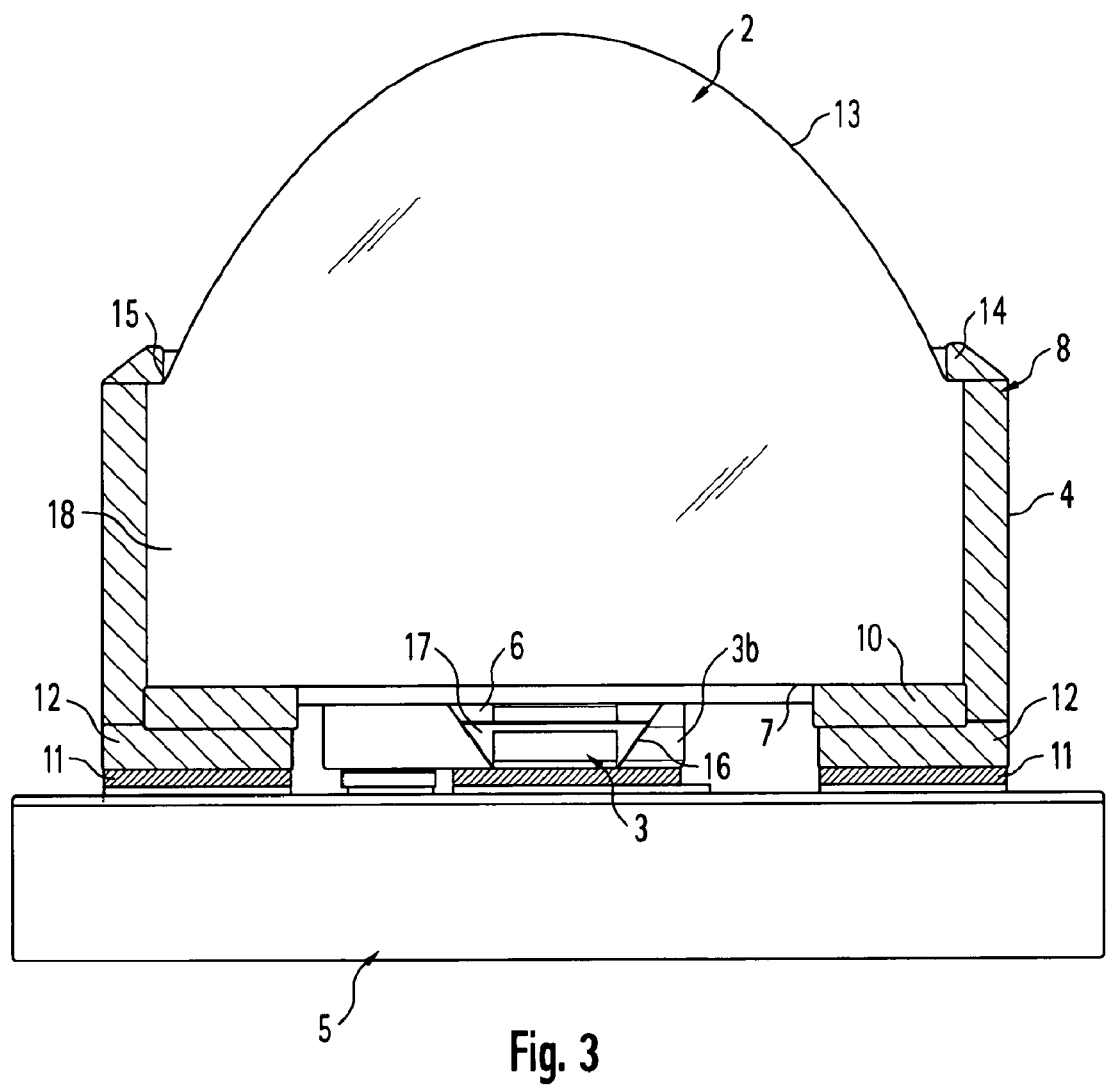
FIG. 3 shows a cross-sectional view of a LED module according to the present invention.
Figure 4:
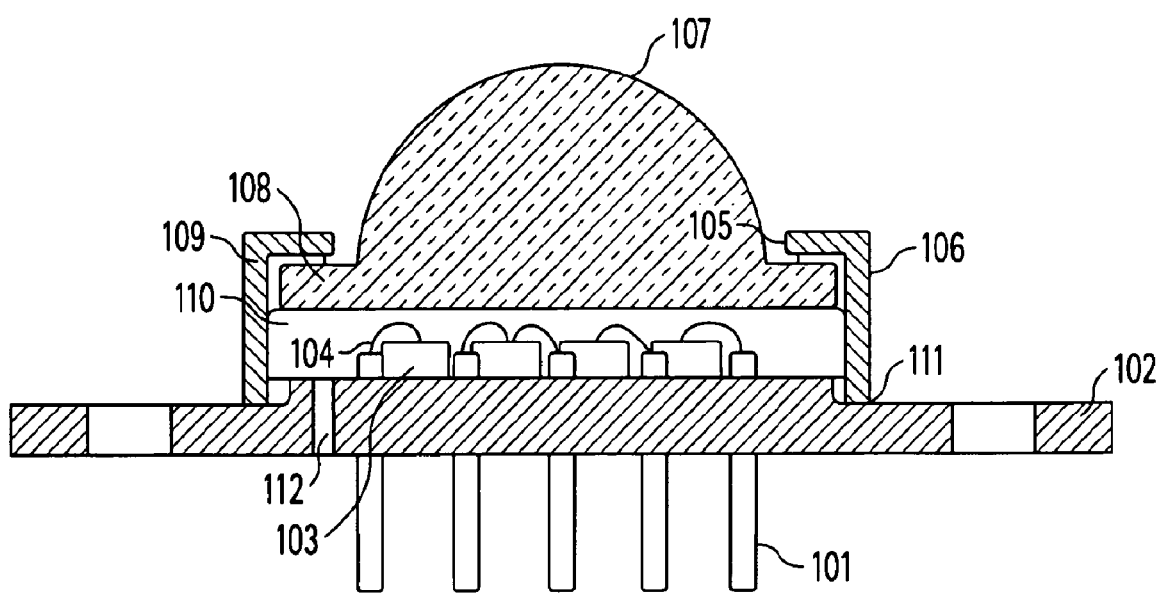
FIG. 4 shows a LED module known from the prior art JP 2006140281 A.

As can be seen from FIG. 2, the holder 4 is preferably provided with a plurality of soldering feet 12 respectively soldered on associated soldering pads (11 in FIG. 3).

In view of the fact that the lens/holder unit is positioned using a plurality of solder pads 11, a highly precise positioning can be achieved and during the reflow soldering process the solder legs 12 of the holder 4 will self-center on the associated solder pad 11.

As can be better seen from FIG. 3, latching noses 14 provided at the upper ends of the spring arm 8 of the holder 4 can engage the outer surface of the lens 2. This clamping engagement can be improved either by providing the outer surface of the lens 2 with a peripheral groove 9 (see FIG. 1) or a stepped (recessed) portion 15. Any other arrangement is viable which ensures the holder 4 clamping at least a part of the lens 2.

In the example shown in FIG. 3 the lens 2 is constituted by an essentially cylindrical base body 18 on top of which a hemispherical portion 13 is provided.

The bottom surface 7 of the cylindrical portion 18 is flat.

The LED chip 3 is preferably SMD mounted on the substrate (circuit board) 5 and can be surrounded by a reflector 16 having inclined walls.

Between the reflector 16 and the LED chip 3 a transparent material 17 can be filled which can comprise e.g. colour conversion substances (phosphors, etc,) and/or scattering particles.

Light emitted from the top surface of the LED chip 3 will thus pass through the air gap 6 before entering the lens 2 at its flat bottom 7. When entering the lens 2 in its bottom surface 7, the angle of the light rays will be refracted towards the vertical, thus such that a narrower emission beam angle of the LED module 1 can be achieved.

Preferably, the solder pads 11 as shown in FIG. 3 can have a thickness between 0.01 mm and 0.5 mm.

The self-centering of the legs 12 of the holder 4 can be achieved when the solder when melted has a surface tension which searches as a natural law as state of minimum energy which is most often given in the symmetric adjustment of each solder surface (solder legs 12) to the solder pad 11.

List of Reference Numerals

1 LED module
2 Lens
3 LED chip
3b LED package (LED chip in a coated housing)
4 Holder
5 Substrate
6 Air gap
7 Bottom face of lens
8 Spring arms
9 Peripheral groove in lens
10 Part of the holder connecting the spring arms
11 Solder pad on substrate
12 Solder feet of holder
13 Hemispheric contour of the lens
14 Clamping (latching) nose of the spring arm of the holder
15 Recessed portion of the lens
16 Reflector
17 Transparent coating, e.g. containing color-conversion substance
18 Cylindrical lower portion of the lens

The invention claimed is:

1. An LED (light-emitting diode) module, comprising:
   an LED chip or an LED package mounted on a substrate, a lens, and
   a mechanical metal holder soldered on the substrate, wherein the holder comprises spring arms for elastically engaging the lens and the mechanical metal holder is designed to act as a spacer for defining an air gap between the light exit surface of the LED chip and the bottom face of the lens.

2. The LED module according to claim 1, wherein the LED package is soldered on the substrate.

3. The LED module according to claim 1, wherein the LED package and the holder with the lens are soldered in a single process step.

4. The LED module according to claim 1, wherein the LED package and the holder together with the lens are assembled together with an pick and place automat and then soldered in a single process step.

5. The LED module according to claim 1, wherein the air gap is about 0.1 mm to about 0.3 mm.

6. The LED module according to claim 1, wherein the spring arms engage a peripheral groove or a recess provided in the lens.

7. The LED module according to claim 1, wherein the metal holder comprises a connection part for connecting the spring arms, the connection part being at least partially provided between the bottom face of the lens and the substrate.

8. The LED module according to claim 1, wherein the lens is made from glass or silicone.

9. The LED module according to claim 1, wherein the metal holder is soldered on a plurality of solder pads provided on the substrate.

10. The LED module according to claim 1, wherein the metal holder holds the lens by clamping the lens.

11. The LED module according to claim 1, wherein the lens has the shape of a hemisphere or a part thereof.

12. An LED (light-emitting diode) module, comprising:
    an LED chip or an LED package mounted on a substrate, a lens, and
    a mechanical metal holder soldered on the substrate, wherein the holder comprises spring arms for elastically engaging the lens and the mechanical metal holder is designed to act as a spacer for defining an air gap between the light exit surface of the LED chip and the bottom face of the lens.

13. The LED module according to claim 12, wherein the metal holder holds the lens by clamping the lens.

14. The LED module according to claim 12, wherein the LED chip is mounted as a surface-mount device (SMD) package.

15. The LED module according to claim 12, wherein the metal holder holds the lens by elastically clamping the lens.

16. A method for mounting a lens over an LED (light-emitting diode) package, comprising the steps of:
    mechanically holding the lens in a metal holder/lens unit, wherein the holder comprises spring arms, and the holder elastically engages the lens by said spring arms,
    placing the LED package on a substrate, and
    soldering the LED package together with the pre-assembled holder/lens unit onto the substrate in one soldering process step.

* * * * *